United States Patent
Lo et al.

(10) Patent No.: US 7,727,703 B2
(45) Date of Patent: Jun. 1, 2010

(54) METHODS OF FABRICATING AN ELECTRONIC DEVICE AND AN SILILATION POLYVINYL PHENOL FOR A DIELECTRIC LAYER OF AN ELECTRONIC DEVICE

(75) Inventors: Po-Yuan Lo, Taipei (TW); Feng-Yu Yang, Taichung County (TW); Zing-Way Pei, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 757 days.

(21) Appl. No.: 11/594,154

(22) Filed: Nov. 8, 2006

(65) Prior Publication Data

US 2008/0063983 A1   Mar. 13, 2008

(30) Foreign Application Priority Data

Aug. 14, 2006   (TW) .............................. 95129771 A (51) Int. Cl.
    G03F 7/00       (2006.01)
    G03F 7/004      (2006.01)
    G03F 7/075      (2006.01)
(52) U.S. Cl. ................. 430/270.1; 430/311; 430/271.1; 430/905; 525/100
(58) Field of Classification Search .............. 430/270.1, 430/311, 271.1, 905; 525/100
    See application file for complete search history.

(56) References Cited

U.S. PATENT DOCUMENTS

| | | | | |
|---|---|---|---|---|
| 4,144,376 A | * | 3/1979 | Beckmann et al. | 428/429 |
| 4,791,171 A | * | 12/1988 | Cunningham | 525/100 |
| 4,867,838 A | * | 9/1989 | Brooks et al. | 216/38 |
| 5,008,362 A | * | 4/1991 | Wilharm et al. | 528/28 |
| 5,270,151 A | * | 12/1993 | Agostino et al. | 430/313 |
| 5,384,192 A | * | 1/1995 | Long et al. | 428/336 |
| 6,844,131 B2 | * | 1/2005 | Oberlander et al. | 430/270.1 |
| 2004/0002176 A1 | | 1/2004 | Xu | |
| 2004/0072436 A1 | * | 4/2004 | RamachandraRao et al. | 438/692 |
| 2005/0026080 A1 | | 2/2005 | Jung | |
| 2006/0214154 A1 | * | 9/2006 | Yang et al. | 257/40 |

FOREIGN PATENT DOCUMENTS

| | | |
|---|---|---|
| EP | 285025 A2 * | 10/1988 |
| JP | 01239545 A * | 9/1989 |
| TW | 548310 | 8/2003 |
| TW | 250826 | 3/2006 |

OTHER PUBLICATIONS

2006 International Conference on Solid State Devices and Materials, Sep. 13-15, 2006, Kanagawa, Japan, pp. 1-24.

(Continued)

*Primary Examiner*—Amanda C. Walke
(74) *Attorney, Agent, or Firm*—Birch, Stewart, Kolasch & Birch, LLP (57) ABSTRACT

A method of fabricating an electronic device is disclosed. The method of fabricating an electronic device comprises providing a substrate. A first conductive layer is formed on the substrate. A silylation polyphenol (PVP) dielectric layer is formed on the first conductive layer. A patterned second conductive layer is formed on the silylation PVP dielectric layer.

18 Claims, 5 Drawing Sheets

OTHER PUBLICATIONS

Lo et al., Extended Abstracts of the 2006 International Conference on Solid State Devices and Materials, Yokohama, 2006, pp. 923-933.

Müller et al., Journal of Applied Physics 98, pp. 1-3, 2005.

Yoon et al., Journal of the American Chemical Society, vol. 127, No. 29, 2005, pp. 1-8.

* cited by examiner

METHODS OF FABRICATING AN ELECTRONIC DEVICE AND AN SILILATION POLYVINYL PHENOL FOR A DIELECTRIC LAYER OF AN ELECTRONIC DEVICE

BACKGROUND OF THE INVENTION

1. Field of the Invention

The present invention relates to a fabricating method of an electronic device, and in particular to a method of fabricating silylation polyvinyl phenol (PVP) for a dielectric layer of an electronic device.

2. Description of the Related Art

Organic thin film transistors (OTFTs) have drawn considerable interest in the past due to their low weight, economical large area fabrication cost, simple fabrication method, thin profile, and mechanical flexibility. Thus, OTFTs are employed in disposable products, radio frequency identification (RFID), smart levels, smart tags or other devices. Coating or inkjet printing is used for OTFT fabrication. Interfaces between dielectric layers and organic semiconductor layers of OTFTs exhibit electron trapping behavior due to the existence of hydroxyl groups. Electron trapping behavior degrades electron mobility and raises transistor threshold voltage (Vt). Industrial OTFTs must have higher electron mobility and lower Vt. Thus, further investigation of dielectric materials for OTFTs is important.

Dissolving is another problem of an organic thin film and an organic solvent with strong polarity used in OTFT fabrication. Dissolving results in organic thin film damage, electron mobility degradation and raised Vt. Pursuit of a solution to the aforementioned dissolving problem is also important.

"A polymer high-k dielectric insulator for organic field-effect transistors" in Journal of Applied Physics 98, 156104 discloses a polymer dielectric layer which is made of poly(vinylidene fluoride) (PVDF) and its copolymer with trifluoroethylene (P(VDF-TrFE)) which has a measured relative dielectric constant of about 11. This ferromagnetic polymer for top gate organic thin film transistors suffers from a time difference between charge accumulation and release. This problem results in abnormal transistor switching at different operating voltages. The PVDF polymer also has a lower melting point (166° C.~170° C.) than polyvinyl phenol (PVP), which has a 360° C. melting point. "Low-voltage organic field-effect transistors and inverters enabled by ultra thin cross-linked polymers as gate dielectrics" in Journal of Applied Chemical Society 2005, 127, 10388 discloses a cross-linked PVP. The cross-linked PVP, which is fabricated with a cross-linking reagent, such as $C_0$, $C_6$ or $C_{12}$, is used as a gate dielectric layer for low-voltage organic field-effect transistors and inverters.

BRIEF SUMMARY OF INVENTION

A detailed description is given in the following embodiments with reference to the accompanying drawings.

A method for fabricating an electronic device is provided by employing silylation polyvinyl phenol (PVP) for a dielectric layer to improve the issues as illustrated. Some embodiments of an electronic device fabrication method comprise: providing a substrate; forming a first conductive layer on the substrate; forming a silylation polyvinyl phenol (PVP) dielectric layer on the first conductive layer; forming a patterned second conductive layer on the silylation polyvinyl phenol dielectric layer.

Some embodiments of an electronic device fabrication method comprise: providing a substrate; forming a first conductive layer on the substrate; forming a silylation polyvinyl phenol (PVP) dielectric layer on the first conductive layer; forming a patterned second conductive layer on the silylation polyvinyl phenol dielectric layer. The method of fabricating an electronic device can further comprise: dissolving a polyvinyl phenol powder in a solvent to form a polyvinyl phenol solution; dissolving a (3-Aminopropyl)-triethoxysilane (ETS) or octadecyl-trichlorosilane (OTS) solution in a solvent to form a silylation polyvinyl phenol solution; forming the silylation polyvinyl phenol solution on the first conductive layer; and removing the solvent in the silylation polyvinyl phenol solution before forming the silylation polyvinyl phenol dielectric layer.

Some embodiments of silylation polyvinyl phenol for a dielectric layer of an electronic device fabrication method comprise: adding a modifier in polyvinyl phenol which reacts with the hydroxyl group of polyvinyl phenol and forming silylation polyvinyl phenol, wherein the modifier comprises (3-Aminopropyl)-triethoxysilane (ETS) or Octadecyl-trichlorosilane (OTS).

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1a to 1d and FIGS. 2a to 2e show cross sections of various embodiments of a process of fabricating an electronic device. Wherever possible, the same reference numbers are used in the drawing and the description to refer the same or like parts.

Figure 1A:
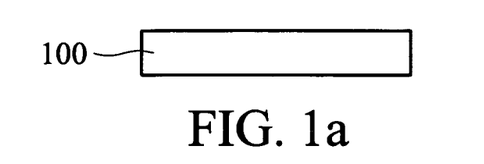
FIGS. 1a to 1d show cross sections of a first embodiment of the process of fabricating a semiconductor device.

FIG. 1a shows the initial step of a first embodiment of forming a metal-insulator-metal capacitor (MIM) 10a. A substrate 100 is provided. The substrate 100 may comprise inorganic materials, for example, n-doped silicon substrates with a resistivity of about 0.008~0.02 ohm-cm, or glass substrates. The substrate 100 may also comprise organic polymers such as polyimide, polycarbonate (PC) or polyethylene terephthalate (PET).

Figure 1B:
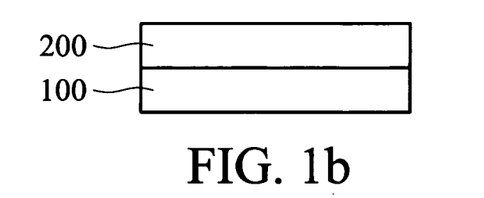

Referring to FIG. 1b, a first conductive layer 200 is formed on the substrate 100. The first conductive layer 200 may be a conductive metal layer such as Au, Pt or an alloy thereof. The first conductive layer 200 may be a conductive polymer layer comprising ethylene glycol-doped poly(3,4-ethylenedioxy-thiophene)/poly(styrenesulfonate) (PEDOT:PSS+EG). When the first conductive layer 200 is a conductive polymer layer, the step of forming the first conductive layer 200 further comprises dissolving a conductive polymer powder in a solvent such as ether, ketone or ester. The solvent may also comprise isopropyl alcohol (IPA) or ethanol. Next, a conductive polymer solution with a conductive polymer concentration of about 0.5 wt % to about 20 wt % (weight percentage) is formed. Next, the conductive polymer solution is formed on the substrate by spin-coating, inkjet-printing, casting, roll-to-roll printing or evaporation. Next, the solvent in the conductive polymer solution is removed by baking and the first conductive layer 200 is formed on the substrate 100. The first conductive layer 200 has a thickness of about 40 to 200 nm. In this embodiment, the first conductive layer 200 serves as the bottom electrode of the MIM 10a.

Figure 1C:
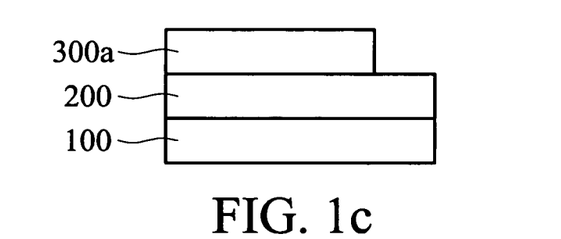

Referring to FIG. 1c, a patterned silylation polyvinyl phenol (PVP) dielectric layer 300a is formed on the first conductive layer 200. The step of forming the patterned silylation polyvinyl phenol (PVP) dielectric layer 300a further comprises dissolving a polyvinyl phenol (PVP) powder (manufactured, for example, by Aldrich Co.) in a solvent such as propylene glycol methyl ether acetate (PGMEA) to form a PVP solution with PVP concentration of about 8 wt % to about 11 wt % (weight percentage). Next, a (3-Aminopropyl)-triethoxysilane (ETS) or Octadecyl-trichlorosilane (OTS) powder is dissolved in the PVP solvent. The PVP solvent can be stirred, heated or cooled to form a silylation PVP solution with ETS or OTS concentration of about 0.1 wt % to about 1 wt % (weight percentage). The PVP solvent is stirred for 1 to 10 hrs, preferably for 1 to 5 hrs, more preferably for 3.5 to 4.5 hours The PVP solvent is heated to a temperature of about 25° C. to 150° C., preferably about 25° C. to 100° C., more preferably about 25° C. to 30° C. The PVP solution is cooled to a temperature of about 0° C. to 25° C. The silylation PVP solution is then formed on the first conductive layer 200 by spin-coating, inkjet-printing, casting or roll-to-roll printing. Next, the solvent in the silylation PVP solution is removed by baking. The solvent in the silylation PVP solution is removed at a temperature of about 90° C. to 200° C., preferably at about 90° C. to 150° C., more preferably about 90° C. to 140° C. A silylation polyvinyl phenol (PVP) dielectric layer is formed on the first conductive layer 200. The patterned silylation polyvinyl phenol (PVP) dielectric layer 300a is then formed after photolithography and etching. The process of forming the patterned silylation polyvinyl phenol (PVP) dielectric layer 300a as described is a low temperature process (<200° C.). The process can prevent the transmutation of the substrate 100 comprising organic or polymer materials formed by a high temperature process. In this first embodiment, the thickness of the patterned silylation polyvinyl phenol (PVP) dielectric layer 300a is preferably about 100 nm to 420 nm. The patterned silylation polyvinyl phenol (PVP) dielectric layer 300a serves as an insulator layer of the MIM 10a.

Figure 1D:
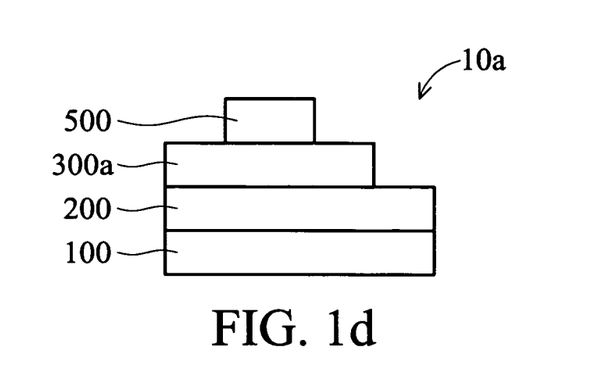

Referring to FIG. 1d, a patterned conductive layer 500 is formed on the patterned silylation polyvinyl phenol (PVP) dielectric layer 300a. A conductive layer is formed by physical vapor deposition (PVD). The patterned conductive layer 500 is formed on the patterned silylation polyvinyl phenol (PVP) dielectric layer 300a after photolithography and etching. The patterned conductive layer 500 may comprise Au or an alloy thereof. In this embodiment, the patterned conductive layer 500 serves as a top electrode of the MIM 10a. Thus, fabrication of the Metal-Insulator-Metal capacitor 10a according to the first embodiment of the invention is completed.

As illustrated, the invention provides a Metal-Insulator-Metal capacitor 10a comprising a substrate 100. A first conductive layer 200 is formed on the substrate 100. A patterned silylation polyvinyl phenol (PVP) dielectric layer 300a is formed on the first conductive layer 200. A patterned conductive layer 500 is formed on the patterned silylation polyvinyl phenol (PVP) dielectric layer 300a.

Figure 2A:
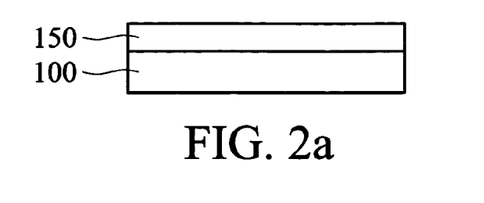
FIGS. 2a to 2e show cross sections of a second embodiment of the process of fabricating a semiconductor device.
Figure 2B:
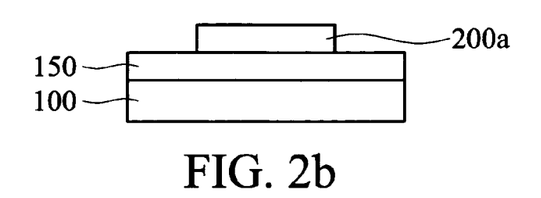

FIGS. 2a to 2e show cross sections of a second embodiment of the process of fabricating an organic thin film transistor 10b. Referring to FIG. 2a, a silicon dioxide layer 150 is formed on the substrate 100 by chemical vapor deposition (CVD). Next, referring to FIG. 2b, a patterned first conductive layer 200a is formed on the silicon dioxide layer 150. The patterned first conductive layer 200a may be a conductive metal layer such as Au, Pt or an alloy thereof. The patterned first conductive layer 200a may also be a conductive polymer layer formed by ethylene glycol-doped poly(3,4-ethylene-dioxy-thiophene)/poly(styrenesulfonate) (PEDOT:PSS+EG). When the patterned first conductive layer 200a is a conductive polymer layer, the step of forming the patterned first conductive layer 200a further comprises dissolving an organic polymer powder in a solvent such as ether, ketone or ester. The solvent may also comprise isopropylalcohol (IPA) or ethanol. Next, an organic polymer solution with the organic polymer concentration of about 0.5 wt % to about 20 wt % (weight percentage) is formed. Next, the organic polymer solution is formed on the silicon dioxide layer 150 by spin coating, inkjet-printing, casting, roll-to-roll printing or evaporation. Next, the solvent in the organic polymer solution is removed by baking. After proceeding photolithography and etching processes, the patterned first conductive layer 200a is formed on the silicon dioxide layer 150.

Figure 2C:
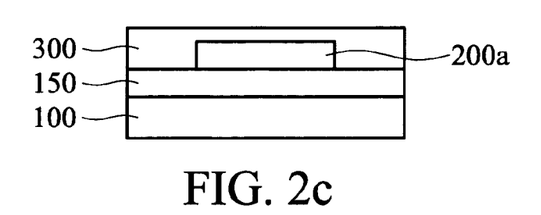

Referring to FIG. 2c, a silylation polyvinyl phenol (PVP) dielectric layer 300 is formed on the patterned first conductive layer 200a and part of the silicon dioxide layer 150. The step of forming the silylation PVP dielectric layer 300 further comprises dissolving a polyvinyl phenol (PVP) powder (manufactured by, for example, Aldrich Co.) in a solvent such as propylene glycol methyl ether acetate (PGMEA) to form a PVP solution with PVP concentration of about 8 wt % to about 11 wt % (weight percentage). Next, a (3-Aminopropyl)-triethoxysilane (ETS) or Octadecyl-trichlorosilane (OTS) powder is dissolved in the PVP solvent). The PVP solvent can be stirred, heated or cooled to form a silylation PVP solution with an ETS or OTS concentration of about 0.1 wt % to about 1 wt % (weight percentage). The PVP solvent is stirred for 1 to 10 hours, preferably for 1 to 5 hours, more preferably for 3.5 to 4.5 hours The PVP solvent is heated to a temperature of about 25° C. to 150° C., preferably about 25° C. to 100° C., more preferably about 25° C. to 30° C. The PVP solution is cooled to a temperature of about 0° C. to 25° C. The silylation PVP solution is then formed on the patterned first conductive layer 200a by spin-coating, inkjet-printing, casting or roll-to-roll printing. Next, the solvent in the silylation PVP solution is removed by baking. The solvent in the silylation PVP solution is removed at a temperature of about 90° C. to 200° C., preferably at about 90° C. to 150° C., more preferably about 90° C. to 140° C. A silylation polyvinyl phenol (PVP) dielectric layer 300 is formed on the patterned first conductive layer 200a and part of the silicon dioxide layer 150.

Figure 2D:
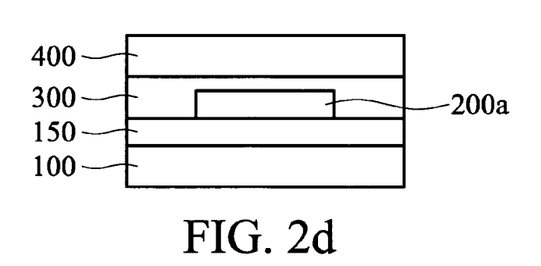

Referring to FIG. 2d, an organic polymer layer 400 is formed on the silylation PVP dielectric layer 300. The step of forming the organic polymer layer 400 further comprises dissolving an organic polymer powder in a solvent such as toluene, dichloromethane, trichloromethane (chloroform) or tetrahydrofuran. Next, an organic polymer solution with an organic polymer concentration of about 0.1 wt % to about 2 wt % (weight percentage) is formed. Next, the organic polymer solution is formed on the substrate by spin-coating, ink-jet-printing, casting, roll-to-roll printing or evaporation. Next, the solvent in the organic polymer solution is removed by baking and the organic polymer layer 400 is formed on the silylation PVP dielectric layer 300. The organic polymer layer 400 comprises pentacene or poly(3-hexylthiophene) (PH3T) both having a thickness of about 30 to 100 nm. In this embodiment, the patterned first conductive layer 200a, the silylation PVP dielectric layer 300 and the organic polymer layer 400 serve as the gate electrode, the gate dielectric layer and the active layer of the organic thin film transistor 10b respectively.

Figure 2E:
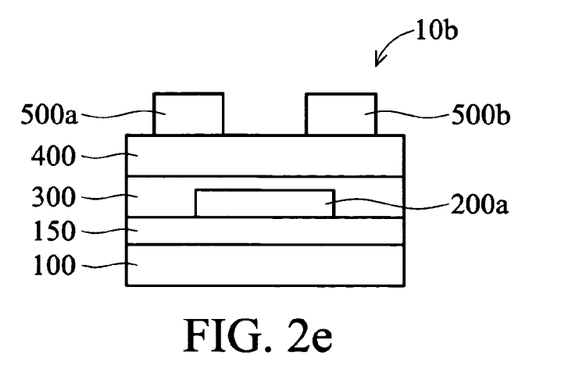

Referring to FIG. 2e, a source 500a/drain 500b is formed on the organic polymer layer 400. A conductive layer is formed by physical vapor deposition (PVD) on the organic polymer layer 400. The source 500a/drain 500b is then formed on the organic polymer layer 400 after photolithography and etching. The source 500a/drain 500b may comprise Au or an alloy thereof. Thus, fabrication of the organic thin film transistor 10b according to the second embodiment of the invention is complete. The devices of the organic thin film transistor 10b are nearly identical to those of the Metal-Insulator-Metal capacitor 10a (as shown in FIG. 1a to FIG. 1d) and for simplicity, their detailed description is omitted.

As illustrated, the invention provides an organic thin film transistor 10b comprising a substrate 100. A silicon dioxide layer 150 is formed on the substrate 100. A patterned first conductive layer 200a is formed on the silicon dioxide layer 150. A silylation PVP dielectric layer 300 is formed on the patterned first conductive layer 200a and part of the silicon dioxide layer 150. An organic polymer layer 400 is formed on the silylation PVP dielectric layer 300. A source 500a/drain 500b is formed on the organic polymer layer 400.

Figure 3:
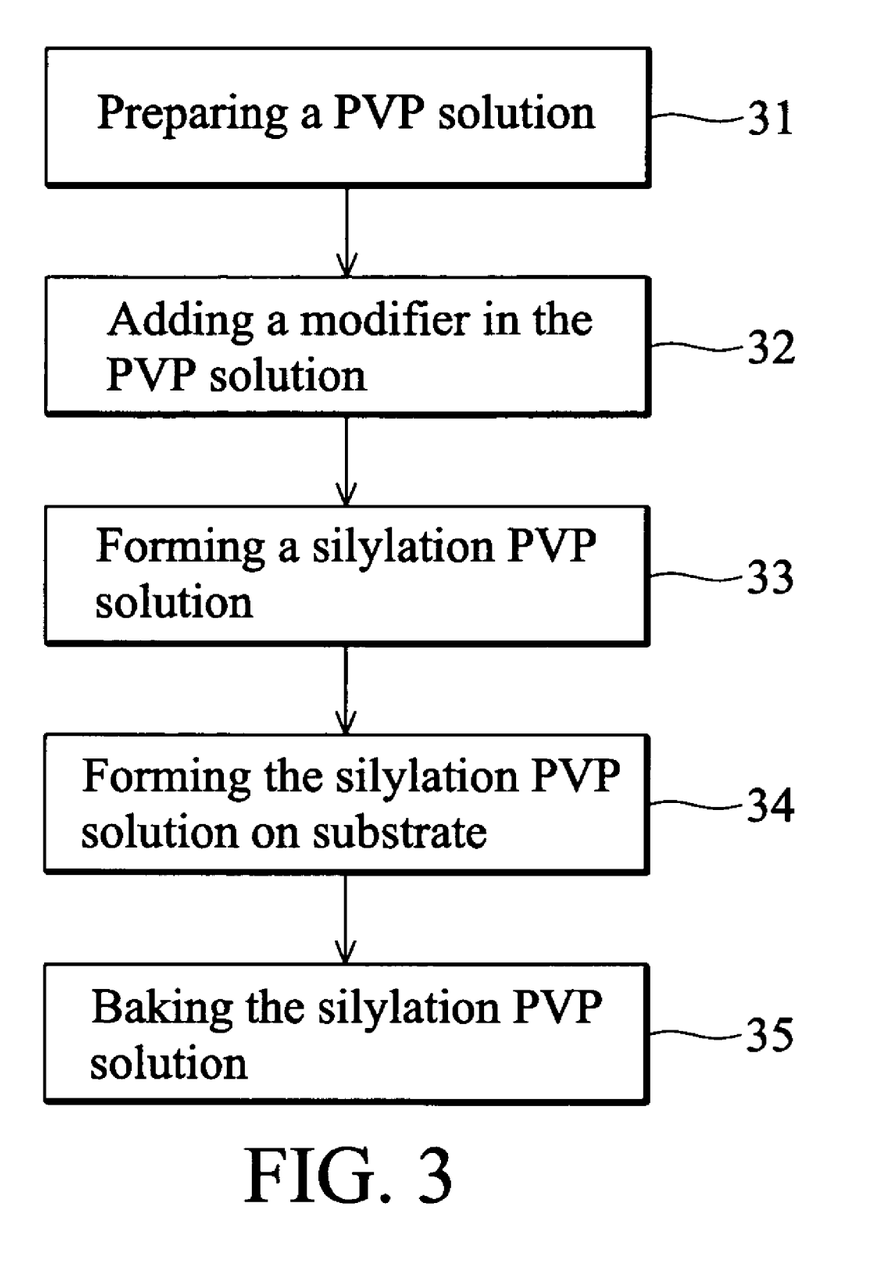
FIG. 3 is a process chart of fabricating a silylation polyvinyl phenol dielectric layer of a semiconductor device.

FIG. 3 illustrates a process chart of an embodiment of a method for fabricating the silylation PVP dielectric layer 300 of the electronic device. As shown in step 31, the step of forming the silylation PVP dielectric layer comprises dissolving a PVP powder in a solvent such as propylene glycol methyl ether acetate (PGMEA) to form a PVP solution with PVP concentration of about 8 wt % to about 11 wt % (weight percentage). As shown in step 32, a modifier such as (3-Aminopropyl)-triethoxysilane (ETS) or Octadecyl-trichlorosilane (OTS) is dissolved in the PVP solvent. As shown in step 33, the PVP solvent can be stirred, heated or cooled to form a silylation PVP solution. The PVP solvent is stirred for 1 to 10 hrs, preferably for 1 to 5 hours, more preferably for 3.5 to 4.5 hours The PVP solvent is heated to a temperature of about 25° C. to 150° C., preferably about 25° C. to 100° C., more preferably about 25° C. to 30° C. The PVP solution is cooled to a temperature of about 0° C. to 25° C. As shown in step 34, the silylation PVP solution is formed on the first conductive layer 200 by spin-coating, inkjet-printing, casting or roll-to-roll printing. As shown in step 35 the solvent in the silylation PVP solution is removed by baking. The solvent in the silylation PVP solution is removed at a temperature of about 90° C. to 200° C., preferably about 90° C. to 150° C., more preferably about 90° C. to 140° C. Thus, formation the PVP dielectric 300 layer on the first conductive layer 200 is complete.

In the fabricating process of the silylation PVP dielectric layer 300, PVP has a modification and ETS and OTS are used as modifiers for PVP modification. The identical recurring unit of PVP having hydroxyl groups is shown as and the number n of the recurring unit is about 150 to 200. In the preferred embodiment, ETS having trialkoxysilane groups is used as the modifier for PVP modification with a structure formula In another embodiment, OTS having trichlorosilane groups is used as the modifier for PVP modification with a structure formula as When ETS or OTS is adding in the PVP solution, the trialkoxysilane group of ETS or the trichlorosilane group of OTS substitutes for part of the hydroxyl group on the branched PVP chain. The color of the PVP solution changes from light yellow to deep yellow and the substitution is finished. Preferably, the reaction formula of the PVP modification with ETS as a modifier is shown as:

In another embodiment, the reaction formula of the PVP modification with OTS as the modifier is shown as:

The silylation PVP dielectric layer is formed by an identical recurring unit of formula 1, wherein n is 25 to 50, R is alkyl with 1~17 carbon atoms, and A is amino or alkyl group.

PVP has a molecular weight of about 20000 to 23000. Preferably, the silylation PVP has a molecular weight of about 20000 to 23000 with ETS as a modifier. Compared with PVP, the molecular weight of the silylation PVP with ETS as a modifier has no obvious change. Thus the result silylation PVP solution maintains solubility.

Figure 4:
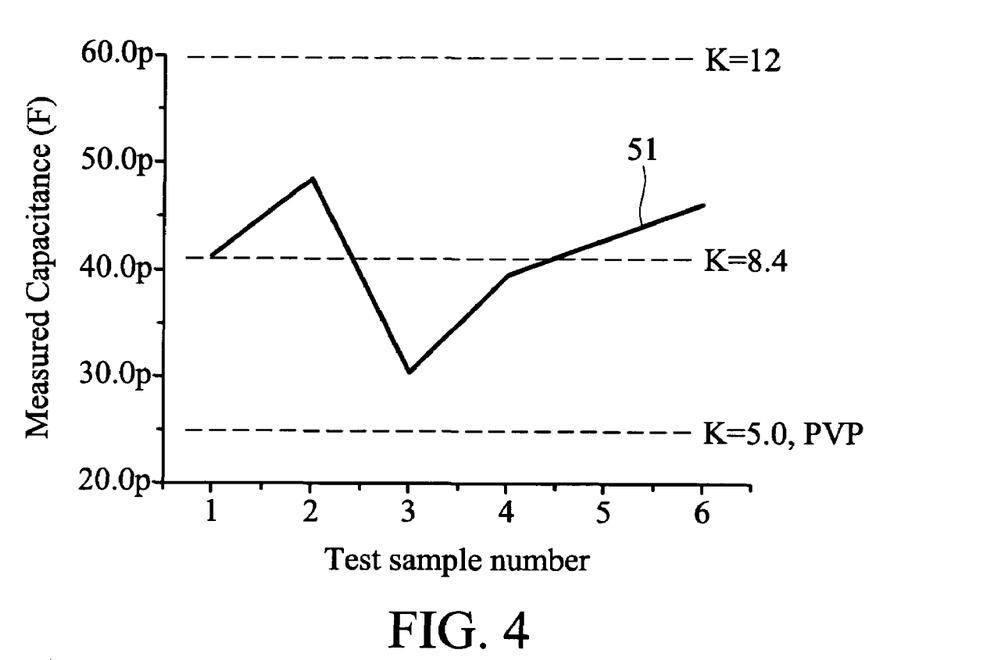
FIG. 4 shows the capacitance comparison for the silylation polyvinyl phenol dielectric layer and the conventional polyvinyl phenol dielectric layer used in a metal-insulator-metal capacitor.

FIG. 4 illustrates the capacitance comparison for the silylation PVP dielectric layer and the conventional PVP dielectric layer using in a metal-insulator-metal capacitor. When ETS is used as a modifier for PVP modification, the functional group of the substituted group may increase the dielectric constant (k) of PVP. The PVP modification is preferably bulk modification and not only surface modification. In FIG. 4, the capacitance of the silylation PVP 51 (thickness=420 nm, k=8.4) is higher than the PVP (thickness=420 nm, k=5), the capacitance of which is similar to a conventional $Al_2O_3$ layer. The silylation PVP dielectric layer can increase the transistor current and reduce the operating voltage of the organic thin film transistor when used as a gate dielectric layer therein.

Figure 5A:
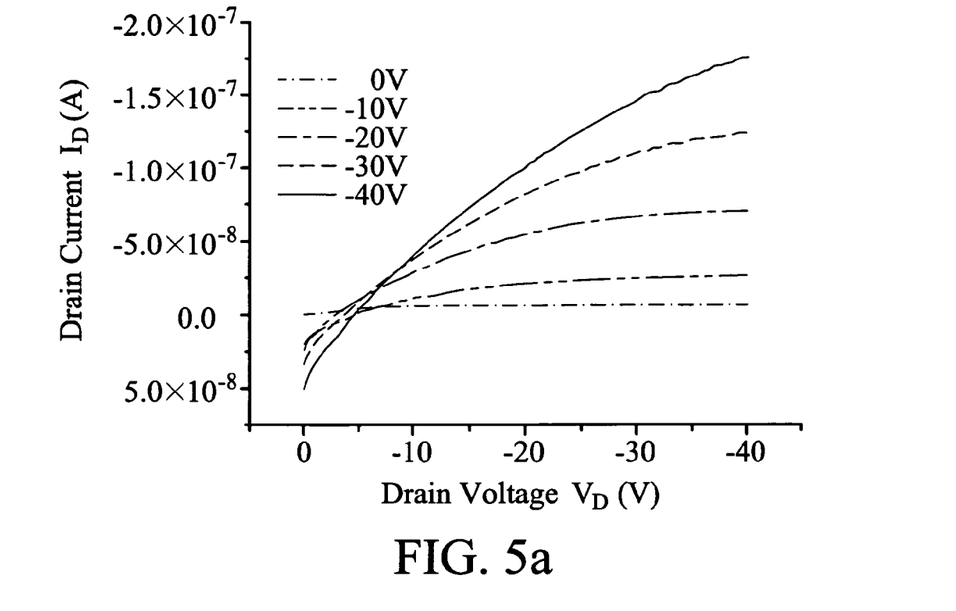
FIG. 5a is a drain-current (Id) versus drain-voltage (Vd) characteristic of a fabricated organic thin film transistor of silylation polyvinyl phenol dielectric layer for a dielectric layer.
Figure 5B:
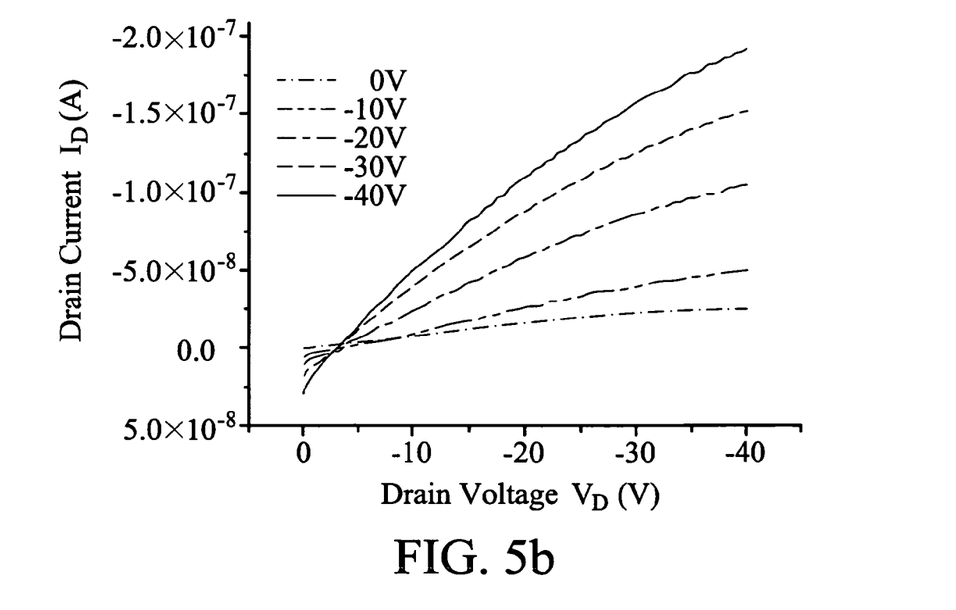
FIG. 5b is a drain-current (Id) versus drain-voltage (Vd) characteristic of a fabricated organic thin film transistor of polyvinyl phenol dielectric layer for a dielectric layer.

Referring to FIGS. 5a and 5b, a drain-current (Id) versus drain-voltage (Vd) characteristic of a silylation PVP dielectric layer and a PVP dielectric layer is illustrated. FIG. 5a shows the Id saturation characteristic at 40V Vd. The silylation PVP dielectric layer of the invention has the Id saturation characteristic. The silylation PVP dielectric layer can have a lower operation voltage than the PVP dielectric layer when used as a dielectric layer therein.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating an electronic device, comprising:
    providing a substrate;
    forming a first conductive layer on the substrate;
    forming a silylation polyvinyl phenol (PVP) dielectric layer on the first conductive layer;
    forming a patterned second conductive layer on the silylation polyvinyl phenol dielectric layer, wherein the silylation polyvinyl phenol dielectric layer comprising identical recurring units of Formula 1, wherein n is 25 to 50, R is alkyl with 1-17 carbon atoms, and A is amino or alkyl group.

2. The method of fabricating an electronic device as claimed in claim 1, further comprising:

dissolving a polyvinyl phenol powder in a solvent to form a polyvinyl phenol solution;

dissolving a (3-Aminopropyl)-triethoxysilane (ETS) or octadecyl-trichlorosilane (OTS) powder in a solvent to form a silylation polyvinyl phenol solution;

forming the silylation polyvinyl phenol solution on the first conductive layer; and removing the solvent in the silylation polyvinyl phenol solution before forming the silylation polyvinyl phenol dielectric layer.

3. The method of fabricating an electronic device as claimed in claim 1, further comprising:

heating or cooling the polyvinyl phenol solution before forming the silylation polyvinyl phenol solution.

4. The method of fabricating an electronic device as claimed in claim 3, wherein the polyvinyl phenol solution is heated to a temperature of about 25° C. to 150° C.

5. The method of fabricating an electronic device as claimed in claim 3, wherein the polyvinyl phenol solution is cooled to a temperature of about 0° C. to 25° C.

6. The method of fabricating an electronic device as claimed in claim 1, wherein the amino group is (3-Aminopropyl)-triethoxysilane (ETS).

7. The method of fabricating an electronic device as claimed in claim 1, wherein the alkyl group is octadecyl-trichlorosilane (OTS).

8. The method of fabricating an electronic device as claimed in claim 1, wherein the polyvinyl phenol solution is formed on the substrate by spin-coating, inkjet-printing, casting, roll-to-roll printing or evaporation.

9. The method of fabricating an electronic device as claimed in claim 2, wherein the first solvent in the silylation polyvinyl phenol solution is removed at a temperature of about 90° to 200°.

10. The method of fabricating an electronic device as claimed in claim 2, wherein the silylation polyvinyl phenol solution has a weight concentration of about 0.1 wt % to about 10 wt % of (3-Aminopropyl)-triethoxysilane (ETS) or octadecyl-trichlorosilane (OTS).

11. The method of fabricating an electronic device as claimed in claim 2, wherein the silylation polyvinyl phenol solution has a weight concentration of about 0.1 wt % to about 1 wt % of (3-Aminopropyl)-triethoxysilane (ETS) or octadecyl-trichlorosilane (OTS).

12. The method of fabricating an electronic device as claimed in claim 1, wherein the silylation polyvinyl phenol dielectric layer has a thickness of about 100 nm to 420 nm.

13. The method of fabricating an electronic device as claimed in claim 1, further comprising:

dissolving an organic polymer powder in a third solvent to form an organic polymer solution;

forming the organic polymer solution on the substrate;

removing the third solvent in the organic polymer solutions and forming an organic polymer layer on the substrate, wherein the organic polymer layer is between the silylation polyvinyl phenol dielectric layer and the patterned second conductive layer before forming the patterned second conductive layer.

14. The method of fabricating an electronic device as claimed in claim 13, further comprising:

forming a silicon dioxide layer on the substrate, wherein the silicon dioxide layer is between the substrate and the first conductive layer before forming the silylation polyvinyl phenol dielectric layer.

15. A method of fabricating silylation polyvinyl phenol for a dielectric layer of an electronic device, comprising:

adding a modifier in polyvinyl phenol that reacts with the hydroxyl group of polyvinyl phenol and forming silylation polyvinyl phenol, wherein the modifier comprises (3-Aminopropyl)-triethoxysilane (ETS) or octadecyl-trichlorosilane (OTS), wherein the silylation polyvinyl phenol comprising identical recurring units of Formula 1, wherein n is 25 to 50, R is alkyl with 1-17 carbon atoms, and A is amino or alkyl group.

16. The method of fabricating silylation polyvinyl phenol for a dielectric layer as claimed in claim 15, wherein the amino group is (3-Aminopropyl)-triethoxysilane (ETS).

17. The method of fabricating silylation polyvinyl phenol for a dielectric layer as claimed in claim 15, wherein the alkyl group is Octadecyl-trichlorosilane (OTS).

18. The method of fabricating silylation polyvinyl phenol for a dielectric layer as claimed in claim 15, further comprising:

heating or cooling polyvinyl phenol after adding the modifier to polyvinyl phenol.

* * * * *